US005612545A

United States Patent [19]
Matsuura et al.

[11] Patent Number: 5,612,545
[45] Date of Patent: Mar. 18, 1997

[54] SUPERCONDUCTING QUANTUM INTERFERENCE DEVICE FORMED OF OXIDE SUPERCONDUCTOR THIN FILM

[75] Inventors: Takashi Matsuura; Saburo Tanaka; Hideo Itozaki, all of Hyogo, Japan

[73] Assignee: Sumitomo Electric Industries, Ltd., Osaka, Japan

[21] Appl. No.: 589,242

[22] Filed: Dec. 13, 1995

Related U.S. Application Data

[63] Continuation of Ser. No. 268,112, Jul. 6, 1994, abandoned, which is a continuation of Ser. No. 811,686, Dec. 23, 1991, abandoned.

[51] Int. Cl.[6] .................. H01L 31/0256; H01L 29/06; H01L 39/22
[52] U.S. Cl. .................. 257/31; 257/33; 257/34; 505/190
[58] Field of Search .................. 505/1, 846, 190, 505/234, 238, 239, 700–702, 191; 324/248; 357/5; 257/34–35, 36, 33

[56] References Cited

U.S. PATENT DOCUMENTS

| | | | |
|---|---|---|---|
| 4,996,185 | 2/1991 | Fujimori et al. | 505/1 |
| 5,077,272 | 12/1991 | Chen et al. | 505/1 |
| 5,087,605 | 2/1992 | Hedge et al. | 357/5 |
| 5,112,801 | 5/1992 | Nellis et al. | 505/1 |

FOREIGN PATENT DOCUMENTS

| | | |
|---|---|---|
| 0446145 | 11/1991 | European Pat. Off. . |
| 0493258 | 1/1992 | European Pat. Off. . |
| 56-46580 | 4/1981 | Japan ......... 257/34 |
| 62-273782 | 11/1987 | Japan ......... 357/5 |
| 63-306675 | 12/1988 | Japan ......... 357/5 |
| 110678 | 1/1989 | Japan ......... 257/34 |
| 2-213176 | 8/1990 | Japan ......... 357/5 |

OTHER PUBLICATIONS

Daly et al, "Substrate Step–Edge $YBa_2Cu_3O_7$ rf Squids"; Appl. Phys. Left., vol. 58, #5, 4 Feb. 1991 pp. 543–545.
Applied Physics Letters, vol. 56, No. 7, 12 Feb. 1990, New York, US, pp. 686–688, Laibowitz R.B. et al "All high $T_c$ edge junctions and SQUIDs".
Applied Physics Letters, vol. 57, No. 7, 13 Aug. 1990, New York, US, pp. 727–729, R. Gross et al "Low Noise $YBa2Cu3O7-x$ grain boundary junction dc SQuIDs".
Applied Physics Letters, vol. 58, No. 22, 3 Jun 1991, New York, US pp. 2552–2554, Dilorio M.S. et al "Practical high Tc Josephson junctions and dc SQUIDs operating above 85 K".

*Primary Examiner*—Sara W. Crane
*Attorney, Agent, or Firm*—Kerkam, Stowell, Kondracki & Clarke, P.C.; John C. Kerins

[57] ABSTRACT

A SQUID includes a substrate and a superconducting current path of a patterned oxide superconductor material thin film formed on a surface of the substrate. A c-axis of an oxide crystal of the oxide superconductor material thin film is oriented in parallel to the surface of the substrate.

13 Claims, 1 Drawing Sheet

SUPERCONDUCTING QUANTUM INTERFERENCE DEVICE FORMED OF OXIDE SUPERCONDUCTOR THIN FILM

This is a continuation of application Ser. No. 08/268,112 filed Jul. 6, 1994, now abandoned, which is a continuation of 07/811,686 filed Dec. 23, 1991, now abandoned

BACKGROUND OF THE INVENTION

1. Field of the Invention

The present invention relates to a superconducting quantum interference device (called "SQUID" in the specification), and more specifically to a novel SQUID having a superconducting current path constituted of an oxide superconductor material.

2. Description of Related Art

Of electronic devices utilizing the superconduction phenomenon, a SQUID is one of the devices most advanced in reduction into practice.

The SQUID is formed of a closed-loop superconducting current path having one or two weak links inserted thereto. A superconducting current flowing through the closed-loop superconducting current path cannot exceed a critical current of the weak link portion, and therefore, a current density in the closed-loop superconducting current path is extremely small. Accordingly, the momentum of cooper pairs existing in the superconducting current path is small, and on the other hand, the wavelength of a corresponding electron wave is extremely long. As a result, it can be regarded that the phase is the same in different portions within the superconducting current path. However, if a magnetic field is applied to this superconducting current path, a phase difference occurs in the superconducting current path. By utilizing this unique phenomenon, the SQUID can be used as a magnetic sensor having an extremely high sensitivity.

In fact, the SQUID has already actually been used not only in a fundamental measurement field for a magnetization meter, a NMR, a magnetic thermometer, etc. but also in a medical field for a magnetic cardiograph, an electroencephalograph, a magnetic tracer, etc., and in the field of earth science for a geomagnetism observation, an earthquake prediction, a resource prospecting, etc.

On the other hand, the superconducting material known in the prior art had become a superconductor only at an extremely low temperature not greater than a liquid helium temperature, and therefore, it had not been considered to practically utilize the superconducting material. However, since it was found in 1986 that compound oxide sintered material such as $(La, Ba)_2CuO_4$ or $(La, Sr)_2CuO_4$ are a superconductor material having a high critical temperature (Tc), it has been confirmed from one to another than a compound oxide such as a Y—Ba—Cu—O type compound oxide or a Bi—Ca—Sr—Cu—O type compound oxide shows a superconduction characteristics at an extremely high temperature. This material showing the superconduction characteristics at the high temperature permits to use an inexpensive liquid nitrogen for a cooling medium, application of superconduction technique has abruptly been put under study as an actual matter.

Therefore, if the oxide superconductor is used in the SQUID, it is expected to further promote spread of the SQUID which has been actually used in the above mentioned various fields. However, the SQUID actually formed of the oxide superconductor has internal noise generated by the SQUID itself, and therefore, can have only a substantially low sensitivity. When the SQUID is used as a sensor, it is possible to eliminate external noises by using a high degree of gradiometer, but it is very difficult to eliminate internal noises. Because of this, it is difficult to use the SQUID composed of an oxide superconductor, as a low-noise high-sensitivity sensor.

SUMMARY OF THE INVENTION

Accordingly, it is an object of the present invention to provide a novel SQUID composed of an oxide superconductor material, which has overcome the above mentioned defect of the conventional one and which has a low noise.

According to the present invention, there is provided a SQUID including a substrate and a superconducting current path of a patterned oxide superconductor material thin film formed on a surface of the substrate, a c-axis of an oxide crystal of the oxide superconductor material thin film being oriented in parallel to the surface of the substrate.

As seen from the above, the SQUID in accordance with the present invention is characterized in that the c-axis of the oxide crystal of the oxide superconductor material thin film forming the superconducting current path is oriented in parallel to the surface of the substrate.

It has been known that, general oxide superconduction materials such as a high-Tc copper-oxide type oxide superconductor material typified by a Y—Ba—Cu—O type compound oxide superconductor material, a Bi—Sr—Ca—Cu—O type compound oxide superconductor material, and a TI—Ba—Ca—Cu—O type compound oxide superconductor material, have remarkable anisotropy in its crystal structure, concerning characteristics including a critical current density and others. For example, the typical Y—Ba—Cu—O type compound oxide superconductor material permits a larger superconducting current to flow in a direction perpendicular to a c-axis of the crystal than in a direction of the c-axis of the crystal. Therefore, when the SQUID is formed of the oxide superconductor thin film, since the superconducting current of the SQUID flows in parallel to the substrate, it has been an ordinary practice to utilize an oxide superconductor thin film having its c-axis oriented perpendicularly to the substrate.

However, examining in detail the operation of the above mentioned conventional SQUID, it has been found that in case of the oxide superconductor, a magnetic flux creep is large within a plane perpendicular to the c-axis of the crystal, and therefore, the noise of the SQUID rather becomes large. On the other hand, considering the function of the SQUID, it is not necessary to cause a large current to flow. As a result, it has been concluded that, rather, it is necessary to form the superconducting current path by giving importance to a magnitude of a pinning effect. The present invention has been completed on the basis of this recognition.

Namely, in the above mentioned SQUID in accordance with the present invention, the c-axis of the oxide crystal of the oxide superconductor material thin film forming the superconducting current path is oriented in parallel to the surface of the substrate. The superconducting current path constituted of such an oxide superconductor material thin film is even low in the critical current density, but the flux creep is small. Therefore, it can realize a low noise SQUID.

The present invention can be applied to a SQUID formed of any oxide superconductor material thin film having anisotropy. For example, the present invention can be applied not only to the SQUID formed of a Y type compound oxide superconductor thin film, but also to SQUIDs formed of other copper-oxide type compound oxide superconductor thin film having anisotropy of a pinning effect, including a so-called Bi type compound oxide superconductor thin film, and a so-called Tl type compound oxide superconductor thin film.

A preferred substrate on which the above mentioned SQUID is formed, includes a MgO single crystal, a $SrTiO_3$ single crystal, a $LaAlO_3$ single crystal, a $LaGaO_3$ single crystal, a $Al_2O_3$ single crystal, and a $ZrO_2$ single crystal.

For example, the oxide superconductor thin film having the c-axis in parallel to the substrate can be deposited by using, for example, a (100) surface of a MgO single crystal substrate, a (110) surface of a $SrTiO_3$ single crystal substrate and a (001) surface of a $CdNdAlO_4$ single crystal substrate, as a deposition surface on which the oxide superconductor thin film is deposited.

In addition, the oxide superconductor thin film having the c-axis in parallel to the substrate can be preferably deposited by maintaining a substrate at a temperature which is lower than a substrate temperature which enables a deposited layer to have a c-axis perpendicular to the substrate, by a temperature difference within a range of 10° C. to 100° C., and more preferably, a range of a few tens ° C. to 100° C.

In one embodiment, the weak link of SQUID is formed of a portion of the oxide superconductor material thin film positioned just on a step portion of the substrate. The height of this step can be freely selected from the range of 800Å to 3,000Å. In order to ensure that the weak link is formed of the portion of the oxide superconductor material thin film positioned just on the step portion of the substrate, the thickness of the oxide superconductor material thin film has to be properly selected. If the thickness of the oxide superconductor material thin film is too thin in comparison with the height of the step of the substrate, the oxide superconductor material thin film would be broken at the step portion of the substrate. On the other hand, if the thickness of the oxide superconductor material thin film is too thick in comparison with the height of the step of the substrate, the weak link could not be formed of the portion of the oxide superconductor material thin film positioned just on the step of the substrate. In the case of the step portion having the height of 1,000Å, the thickness of the oxide superconductor material thin film forming the superconducting current path is preferably on the order of 500Å to 5,000Å. In addition, the oxide superconductor material thin film forming the superconducting current path can be formed by a physical deposition or a chemical deposition, both of which are well known to persons skilled in the art. In particular, a sputtering or an ion plating can be advantageously utilized.

The above and other objects, features and advantages of the present invention will be apparent from the following description of a preferred embodiment of the invention with reference to the accompanying drawings. However, it should be noted that the following disclosure is merely one embodiment for making it easier to understand the present invention, and the present invention is in no way limited to the details of the illustrated structures.

DESCRIPTION OF THE PREFERRED EMBODIMENT

Figure 1:
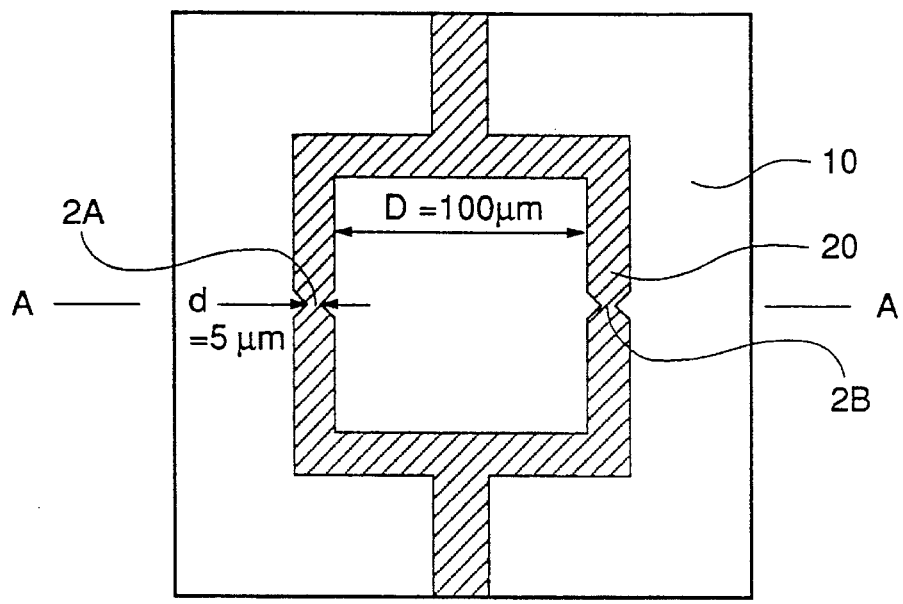
FIG. 1 is a plan view diagrammatically illustrating the SQUID in accordance with the present invention.

Referring to FIG. 1, a plan view of the SQUID in accordance with the present invention is diagrammatically illustrated. The SQUID shown in FIG. 1 is a DC-SQUID having a superconducting current path 20 constituted of a patterned oxide superconductor thin film deposited on a substrate 10. The superconducting current path 20 is in the form of a closed-loop as shown, and has a pair of weak links 2A and 2B located to oppose to each other in the closed-loop.

In the shown example, the substrate 10 is formed of a $SrTiO_3$ monocrystalline substrate having a deposit surface of (110) plane. The oxide superconductor thin film forming the superconducting current path is formed of a (110) oriented Y—Ba—Cu—O type oxide superconductor thin film.

Figure 2:
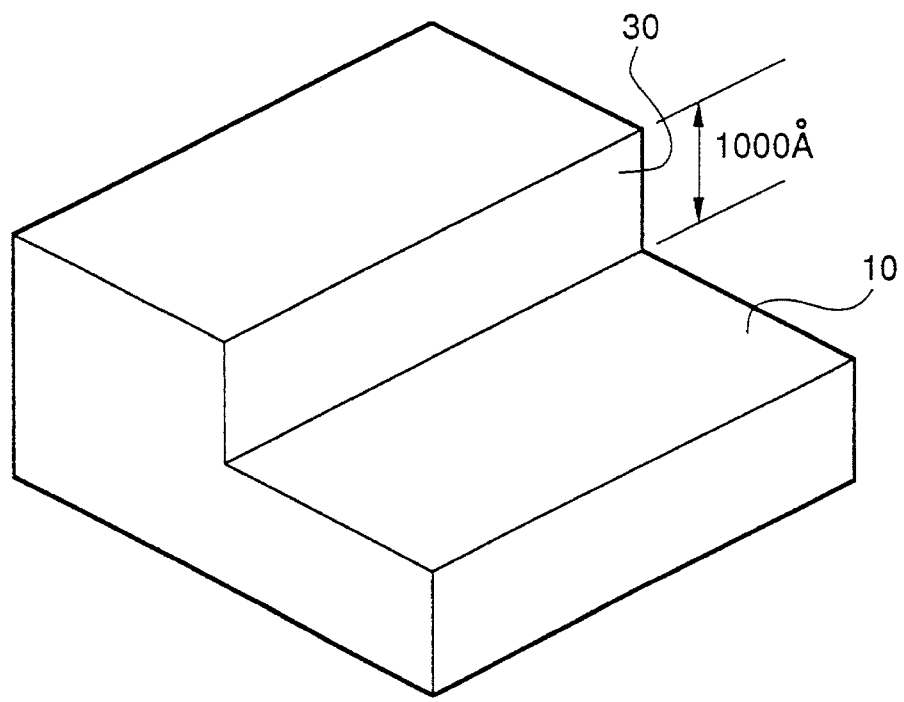
FIG. 2 is an extremely exaggerated diagrammatical perspective view of the substrate on which the oxide superconductor material thin film forming the superconducting current path is formed.

The SQUID having the above mentioned structure was fabricated in the following manner:

A (110) $SrTiO_3$ substrate was shaped by an ion beam so as to have a step 30 having a height of 1000Å, as exaggeratedly shown in FIG. 2. The step 30 will form he pair of weak links 2A and 2B when the closed-loop superconducting current path of the oxide superconductor thin film is formed. The height of this step is not limited to 1000Å, but can be freely selected from the range of 800Å to 3,000Å as mentioned hereinbefore.

The oxide superconductor thin film was deposited on the thus shaped substrate by a sputtering.

A deposition condition for the sputtering is as follows:

Target: Mixture of oxides of Y, Ba and Cu
   Y:Ba:Cu=1.0:2.0:2.6 in atomic ratio Substrate temperature: 550° C.

Sputtering gas: Mixed gas of Ar and $O_2$
   $(O_2/Ar+O_2)=0.2$ (volume ratio)

Sputtering pressure: 50 mTorr

Deposition speed: 10Å/minute

Film thickness: 4000Å

Thereafter, the deposited oxide superconductor thin film is patterned into the form of a square closed loop by using a nitric acid as an etching agent. The patterned square closed loop has an inside square of 100 μm×100 μm, and a line width of 10 μm.

On the other hand, the Y—Ba—Cu—O type oxide superconductor thin film deposited on the step 30 of the substrate becomes polycrystalline. The patterned Y—Ba—Cu—O type oxide superconductor thin film on the step 30 was further etched by an ion etching, so that a pair of narrow portions 2A and 2B each having a length of 5 μm and a width of 5 μm are formed in the square closed loop of the superconducting current path. The pair of narrow portions 2A and 2B form a pair of weak links.

The SQUID thus formed was evaluated by a flux locked loop method. Frequency dependency of energy resolution of the SQUID at 77K is as follows. In the following, the parenthesized values show the characteristics of the SQUID formed of the c-axis oriented film.

| Frequency (Hz) | 10 | $10^2$ | $10^3$ | $10^4$ |
|---|---|---|---|---|
| Resolution (J/Hz) | $1\times10^{-29}$ ($1\times10^{-28}$) | $5\times10^{-30}$ ($3\times10^{-29}$) | $3\times10^{-30}$ ($2\times10^{-29}$) | $1\times10^{-30}$ ($9\times10^{-30}$) |

As seen from the above, the SQUID formed of the (110) oriented film has the energy resolution which is improved by about ten times in comparison with the SQUID formed of the c-axis oriented film.

As will be apparent from the above description, the SQUID in accordance with the present invention can have a low-noise property inherent to the SQUID. In addition, since the SQUID in accordance with the present invention is formed of the High-Tc copper-oxide type oxide superconductor, it can be cooled by a liquid nitrogen. Therefore, the present invention is very effective in promoting the spread of the SQUID.

The invention has thus been shown and described with reference to the specific embodiment. However, it should be noted that the present invention is in no way limited to the details of the illustrated structures but changes and modifications may be made within the scope of the appended claims.

We claim:

1. A SQUID including a substrate and a superconducting current path of a single patterned oxide superconductor material thin film, all of which is formed of the same high-Tc YBCO type oxide superconductor material and which is formed on a surface of the substrate, a c-axis of an oxide crystal of the high-Tc YBCO type oxide superconductor material thin film being oriented in parallel to the surface of the substrate, wherein the oxide superconductor thin film has a thickness in the range of 500Å to 5,000Å, the substrate having a step formed on a deposition surface thereof and the oxide superconductor material thin film being in the form of a closed loop crossing the step, a portion of the oxide superconductor material thin film positioned on the step being polycrystalline and forming a weak link.

2. A SQUID claimed in claim 1 wherein the oxide superconductor material thin film is formed of the material selected from the group consisting of a Y—Ba—Cu—O type compound oxide superconductor material, a Bi—Sr—Ca—Cu—O type compound oxide superconductor material, and a Tl—Ba—Ca—Cu—O type compound oxide superconductor material.

3. A SQUID claimed in claim 1 wherein the substrate is formed of a material selected from the group consisting a MgO single crystal, a SrTiO$_3$ single crystal, a LaAlO$_3$ single crystal, a LaGaO$_3$ single crystal, a Al$_2$O$_3$ single crystal, and a ZrO$_2$ single crystal.

4. A SQUID claimed in claim 1 wherein the substrate is formed of a material selected from the group consisting of a MgO (100) substrate, a SrTiO$_3$ (110) substrate and a CdNdAlO$_4$ (001) substrate.

5. A SQUID as recited in claim 1 wherein the oxide superconductor material thin film is in the form of a square closed loop crossing the step.

6. A SQUID claimed in claim 5 wherein the step has a height in the range of 800Å to 3,000Å.

7. A SQUID claimed in claim 6 wherein the oxide superconductor material thin film has the thickness in the range of 500Å to 5,000Å.

8. A SQUID including a substrate and a superconducting current path of a single patterned oxide superconductor material thin film, all of which is formed of the same high-Tc YBCO type oxide superconductor material and which is formed on a surface of the substrate, a c-axis of an oxide crystal of the high-Tc YBCO type oxide superconductor material thin film being oriented in parallel to the surface of the substrate, wherein the oxide superconductor thin film has a thickness in the range of 500Å to 5,000Å, the substrate having a step formed on a deposition surface thereof and the oxide superconductor material thin film being in the form of a closed loop crossing the step, a portion of the oxide superconductor material thin film positioned on the step being polycrystalline and forming a weak link, and the polycrystalline portion of the superconducting current path of oxide superconductor material thin film on the step having a width narrower than the other portion of the superconducting current path.

9. A SQUID as recited in claim 8 wherein the oxide superconductor material thin film is formed of a material selected from the group consisting of a Y—Ba—Cu—O type compound oxide superconductor material, a Bi—Sr—Ca—Cu—O type compound oxide superconductor material, and a Tl—Ba—Ca—Cu—O type compound oxide superconductor material.

10. A SQUID as recited in claim 8 wherein the substrate is formed of a material selected from the group consisting of an MgO single crystal, an SrTiO$_3$ single crystal, an LaAlO$_3$ single crystal, an LaGaO$_3$ single crystal, an Al$_2$O$_3$ single crystal, and a ZrO$_2$ single crystal.

11. A SQUID as recited in claim 8 wherein the substrate is formed of a material selected from the group consisting of an MgO (100) substrate, an SrTiO$_3$ (110) substrate and a CdNdAlO$_4$ (001) substrate.

12. A SQUID as recited in claim 8 wherein the oxide superconductor material thin film is in the form of a square closed loop crossing the step.

13. A SQUID as recited in claim 12 wherein the step has a height in the range of 800Å to 3,000Å, and the oxide superconductor material thin film has a thickness in the range of 500Å to 5,000Å.

* * * * *